(12) United States Patent
Bodan et al.

(10) Patent No.: US 7,254,146 B2
(45) Date of Patent: Aug. 7, 2007

(54) CONTINUOUS WAVELENGTH TUNING OF DBR LASER

(75) Inventors: Patricia Bodan, Amherst, NH (US); Marcel Gagnon, Londonderry, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 253 days.

(21) Appl. No.: 11/039,589

(22) Filed: Jan. 20, 2005
(Under 37 CFR 1.47)

(65) Prior Publication Data

US 2006/0159134 A1    Jul. 20, 2006

(51) Int. Cl.
*H01S 3/10* (2006.01)
(52) U.S. Cl. ..................................... 372/20; 372/43.01
(58) Field of Classification Search .................. 372/20, 372/43.01
See application file for complete search history.

(56) References Cited

U.S. PATENT DOCUMENTS

| | | | |
|---|---|---|---|
| 5,719,664 A * | 2/1998 | Besesty et al. ............. 356/5.01 |
| 5,798,521 A | 8/1998 | Froggatt ..................... 250/227 |
| 6,545,760 B1 | 4/2003 | Froggat et al. ............. 356/477 |
| 6,566,648 B1 | 5/2003 | Froggat .................. 250/227.14 |
| 6,597,840 B2 | 7/2003 | Jacobowitz et al. .......... 385/37 |
| 6,697,388 B1 * | 2/2004 | Broutin et al. ................ 372/20 |
| 2002/0181519 A1 * | 12/2002 | Vilhelmsson et al. ......... 372/32 |

OTHER PUBLICATIONS

Reusable Cryogenic Tank VHM Using Fiber Optic Distributed Sensing Technology by Bodan (AIAAA-98-1929).*
"Reusable Cryogenic Tank VHM Using Fiber Optic Distributed Sensing Technology" Patricia Bodan; AIAA/ASME/ASCE/AHS/ASC Structures, Structural Dynamics, and Materials Conference; Apr. 20-23, 1998; pp. 1-6.

* cited by examiner

*Primary Examiner*—Dung (Michael) T. Nguyen
(74) *Attorney, Agent, or Firm*—Todd A. Sullivan; Hayes Soloway PC

(57) ABSTRACT

A continuous tunable laser system includes at least one DBR laser. The DBR laser includes a Phase section, a Braggs section, and a gain medium. The DBR laser is capable of generating a continuous-wave laser signal. A Phase current input is electrically connected to the Phase section. A Bragg current input is electrically connected to the Bragg section and synchronized with the Phase current input. A gain control input is electrically connected to the gain medium.

17 Claims, 6 Drawing Sheets

CONTINUOUS WAVELENGTH TUNING OF DBR LASER

FIELD OF THE INVENTION

The present invention is in the field of lasers. More specifically, the present invention is in the field of tuning Distributed Bragg Reflector (DBR) lasers.

BACKGROUND OF THE INVENTION

It is often desirable to measure mechanical strains on certain materials. The use of optical fibers for measuring strains has been employed on many occasions and in various ways. When the fibers are attached to the material under test, the physical forces that stretch, or contract the material, impart the same forces to the fiber. Stress to the optical fibers can also occur as a result of variations in temperature of the environment within which the optical fiber is located. Such physical forces and temperature variation are typically found in aerospace environments such as aircrafts or spacecrafts.

Therefore, rigidly attaching or bonding optical fibers to physical structures can measure strain to the physical structure. Optically measuring strain on the optical fiber then provides information regarding strain on the physical structure. This type of arrangement has been used, for instance, to measure stress in bridges.

Fiber Bragg Gratings have been used to optically measure strain in optical fibers. Fiber Bragg Gratings comprise a portion of the optical fiber where the index of refraction has been changed, such that it reflects a particular resonant wavelength. The Gratings are written on a section of the optical fiber, which is then spliced to longer lead-in, lead-out optical fibers. Coherent light at the resonant wavelength is transmitted down the core of the optical fiber, and reflects off the Bragg Gratings, and passes back up the fiber. The time period between transmitting the light down the core of the optical fiber and receiving the reflected light is measured.

As the grating spacing changes in response to strain, the index of refraction of the grating changes thereby altering the measured time period of modulation of the index of refraction. Multiple Fiber Bragg Grating configurations can also be used for measuring strain. In such a configuration, each Bragg Grating can have a unique central frequency (and no overlap of the frequency response). Thus, multiplexed signals can be transmitted by the optical fiber and discriminated by the Fiber Bragg Gratings.

The lasers typically used to sense strain in optical fiber use a large mechanically rotating and displacing grating element as one of the laser cavity endfaces to continuously tune the wavelength. When tuning a laser, care-must be taken to delicately control the mirror endface such that only one axial mode will be output. The tuning of the laser can also be disrupted by physical vibration, which is not uncommon on a bridge or in other locations where measuring physical strain is desirable. A DBR laser, which is a smaller, electrically controlled laser, would be less mechanically cumbersome for this purpose. However, while physically and mechanically more compact, a DBR laser can be equally cumbersome to tune.

A DBR laser has a semiconductor laser mirror endface and an optical cavity length, which are each modifiable by a current input. There are periodic states (called, "mode hops") that the semiconductor laser mirror endface and the optical cavity length must avoid. Typically, either the semiconductor laser mirror endface is modified to tune the DBR laser or the optical cavity length is modified to tune the laser using its respective current input. The concern of mode hops and the limitations on index of refraction modification and noise concerns discourages the use of DBR lasers for applications that require continuous tuning.

Thus, a heretofore unaddressed need exists in the industry to address the aforementioned deficiencies and inadequacies.

SUMMARY OF THE INVENTION

Embodiments of the present invention provide a system and method for enabling continuous wavelength tuning of a DBR laser. Briefly described in architecture, one embodiment of the system, among others, can be implemented as follows. A continuous tunable laser system includes at least one DBR laser. The DBR laser includes a Phase section, a Braggs section, and a gain medium. The DBR laser is capable of generating a continuous-wave laser signal. A Phase current input is electrically connected to the Phase section. A Bragg current input is electrically connected to the Bragg section and synchronized with the Phase current input. A gain control input is electrically connected to the gain medium.

In another aspect, the invention features a method of enabling continuous wavelength tuning of a DBR laser. The method includes the steps of: using least one DBR laser capable of generating a continuous-wave laser signal, the DBR laser including a Phase section, a Braggs section, and a gain medium; electrically connecting a Phase current input to the Phase section; electrically connecting a Bragg current input to the Bragg section; synchronizing the Bragg current input with the Phase current input; and electrically connecting a gain control input to the gain medium.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
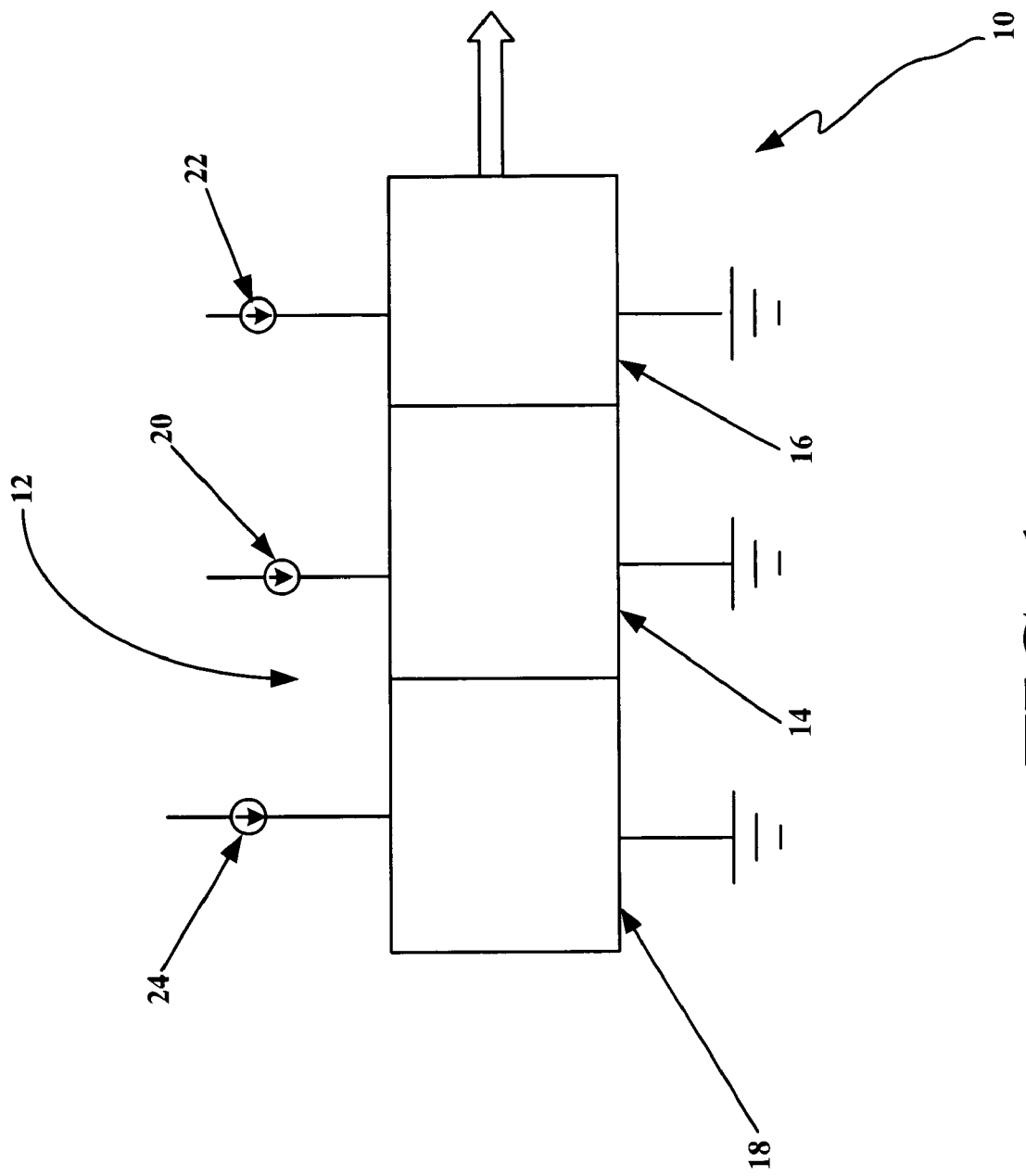
FIG. 1 is a block diagram of a continuous tunable laser system, in accordance with a first exemplary embodiment of the invention.

FIG. 1 is a block diagram of a continuous tunable laser system 10, in accordance with a first exemplary embodiment of the invention. The continuous tunable laser system 10 includes at least one DBR laser 12. The DBR laser 12 includes a Phase section 14, a Braggs section 16, and a gain medium 18. The DBR laser 12 is capable of generating a continuous-wave (not modulated) laser signal. A Phase current input 20 is electrically connected to the Phase section 14. A Bragg current input 22 is electrically connected to the Bragg section 16 and synchronized with the Phase current input 20. A gain control input 24 is electrically connected to the gain medium 18.

The gain control input 24 is the power source for the DBR laser 12. Upon receiving current from the gain control input 24, the gain medium 18 generates and transmits light to the Phase section 14 and the Bragg section 16.

The Phase current input 20 and the Bragg current input 22 are used to tune the DBR laser 12, while the gain control input 24 is used for gain control of the DBR laser 12. The Bragg current input 22 controls a laser cavity Bragg Grating resonant wavelength, through the Braggs section 16, functioning as a coarse tuning tool. The Phase current input 20 controls the Phase section 14 of the DBR laser 12, functioning as a fine-tuning tool. Current injection into the Phase section 14 of the DBR laser 12 will cause the carrier density to increase due to the free-carrier plasma effect, and finely decrease the output wavelengths of the DBR laser 12.

Figure 2:
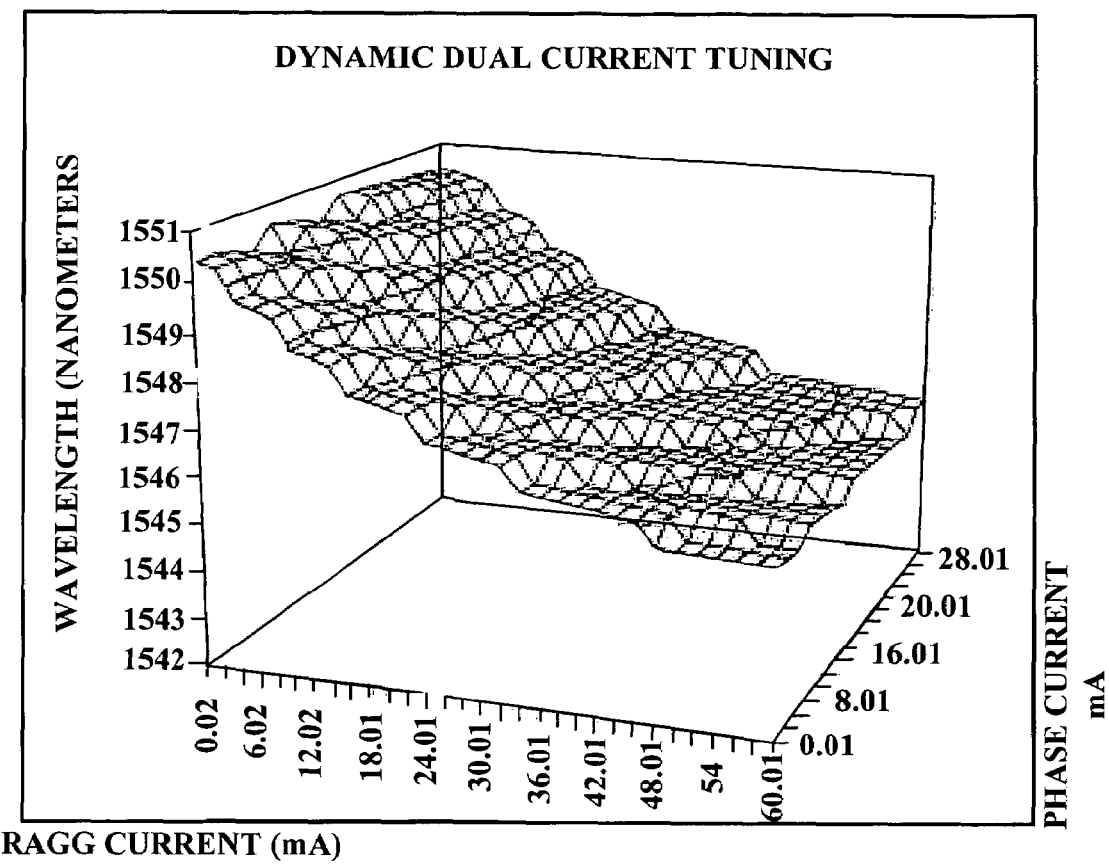
FIG. 2 is a graph illustrating a relationship between the currents and output wavelength for an exemplary DBR laser, as shown in FIG. 1.

FIG. 2 is a graph illustrating a relationship between the currents and output wavelength for an exemplary DBR laser 12 (as shown in FIG. 1). The DBR laser 12 may be characterized as illustrated in FIG. 2, to determine its Phase current input 20 and Bragg current input 22 (collectively "tuning currents") to DBR laser 12 output wavelength relationship. The three-dimensional graph of FIG. 2 may be visually described as a collection of platforms and steep slopes. As so described, if the tuning currents 20, 22 in the DBR laser 12 are set to values that produce one of the "steep slope" (mode hopping) coordinates, a mode hop will occur and, as is known to those having ordinary skill in the art, operation of the DBR laser 12 will not be coherent. If the tuning currents 20, 22 in the DBR laser 12 are set to values that produce one of the "platform" coordinates, the DBR laser 12 will operate as intended. Therefore, to maintain intended operation of the DBR laser 12, the Bragg current input 22 and the Phase current input 20 should be synchronized to avoid "steep slope" coordinates.

As illustrated in FIG. 2, where Bragg current input 22 is approximately 0.02 mA, increasing the Phase current input 20 finely decreases the output wavelengths of the DBR laser 12. Increasing the Phase current input 20 causes the carrier density to increase due to the free-carrier plasma effect. This effect, however, also causes radiation absorption, which reduces laser power. Altering/increasing the gain control input 24 can compensate the reduction in power for wavelength control. Bragg current input 22 injected into the Bragg section 16 of the DBR laser 12 creates a similar effect, thereby shifting a cavity end mirror peak response to a smaller wavelength. An illustration of this effect appears in FIG. 2, where Phase Current is approximately 0.01 mA. For continuous wavelength tuning over the laser tuning range, the Phase current input 20 and the Bragg current input 22 are controlled together in a precise fashion to keep the axial mode selected by the Phase current input 20 aligned with the peak of a DBR laser 12 Bragg grating response. This control insures only one axial mode will be output.

To continuously tune the DBR laser 12 from a longer wavelength to a shorter one, a current ramp is injected into each of the two tuning sections 14, 16 of the DBR laser 12. A current ramp is a steadily increasing or decreasing current. As can be observed by viewing FIG. 2, altering the Bragg current input 22 and/or the Phase Current input 20 will alter the wavelength of the DBR laser 12 output. By using a steady, preferably linear current ramp for the Bragg current input 22 and the Phase current input 20, a DBR laser 12 output with a continuously changing wavelength is created. These current ramps are synchronized and linear so that mode hopping does not occur.

Figure 3:
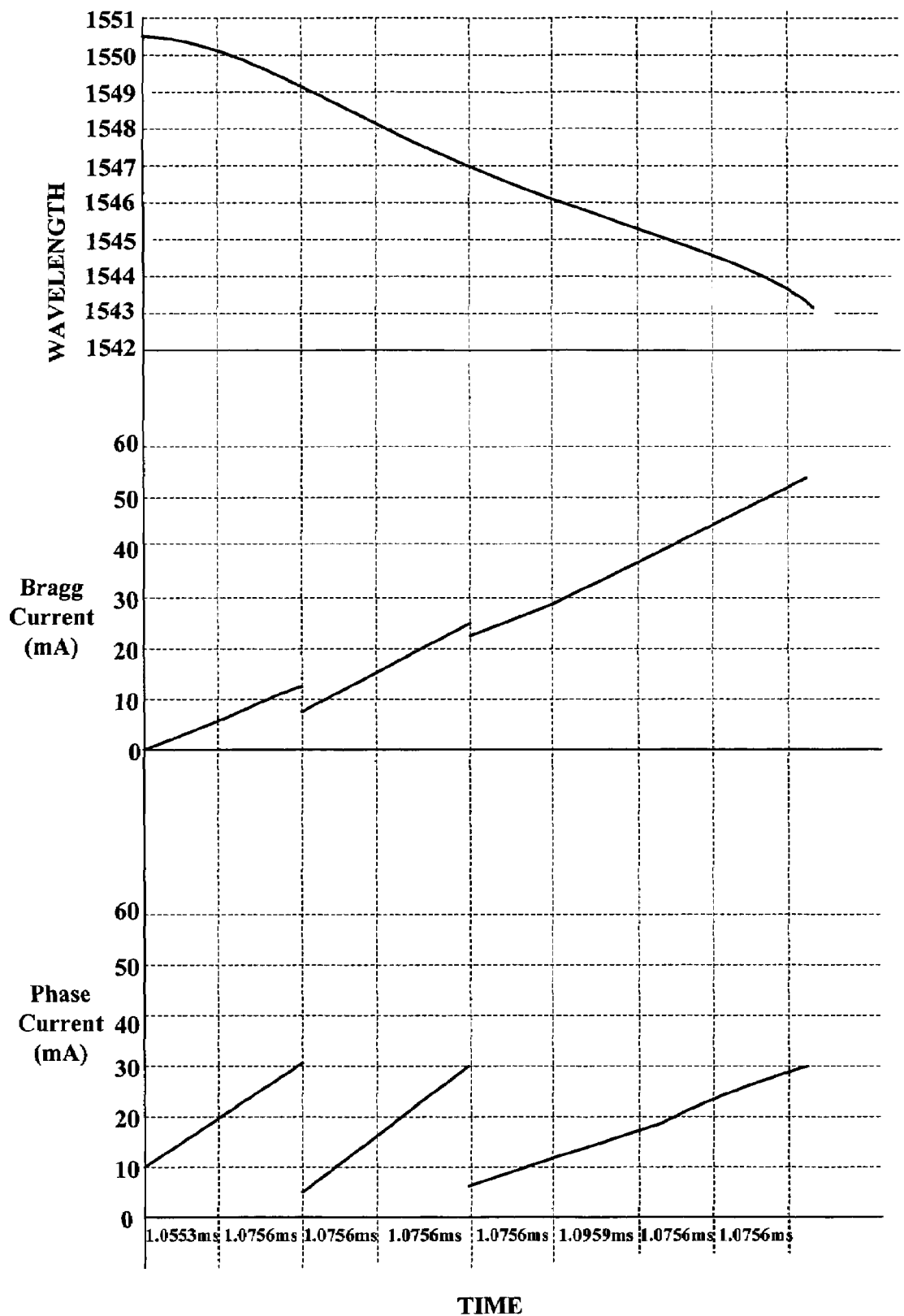
FIG. 3 is a graph illustrating exemplary tuning current inputs for the DBR laser and the exemplary continuous wavelength output, in accordance with the first exemplary embodiment of the invention.

Tuning currents 20, 22, such as the exemplary characteristics shown in FIG. 2, may be used to control and tune the DBR lasers 12. FIG. 3 is a graph illustrating exemplary tuning currents 20, 22 and the respective DBR laser 12 output wavelength for the continuous tunable laser system 10, in accordance with a first exemplary embodiment of the invention. As can readily be seen comparing FIG. 3 and FIG. 2, if the Phase current input 20 and the Bragg current input 22, as shown in FIG. 3, are fed into a DBR laser 12 having the characteristics illustrated in FIG. 2, the DBR laser 12 will produce an output having the wavelength illustrated in FIG. 3, with respect to time. By synchronizing the Phase current input 20 and the Bragg current input 22, as shown in FIG. 3, a continuous tuning wavelength can be output from the DBR laser 12. This exemplary DBR laser 12 output can be used to continuously sweep across an approximately 4 nanometer band. Of course, dependent on the characteristics of the DBR laser and the number of DBR lasers employed, wavelength bands of different sizes may be swept.

Figure 4:
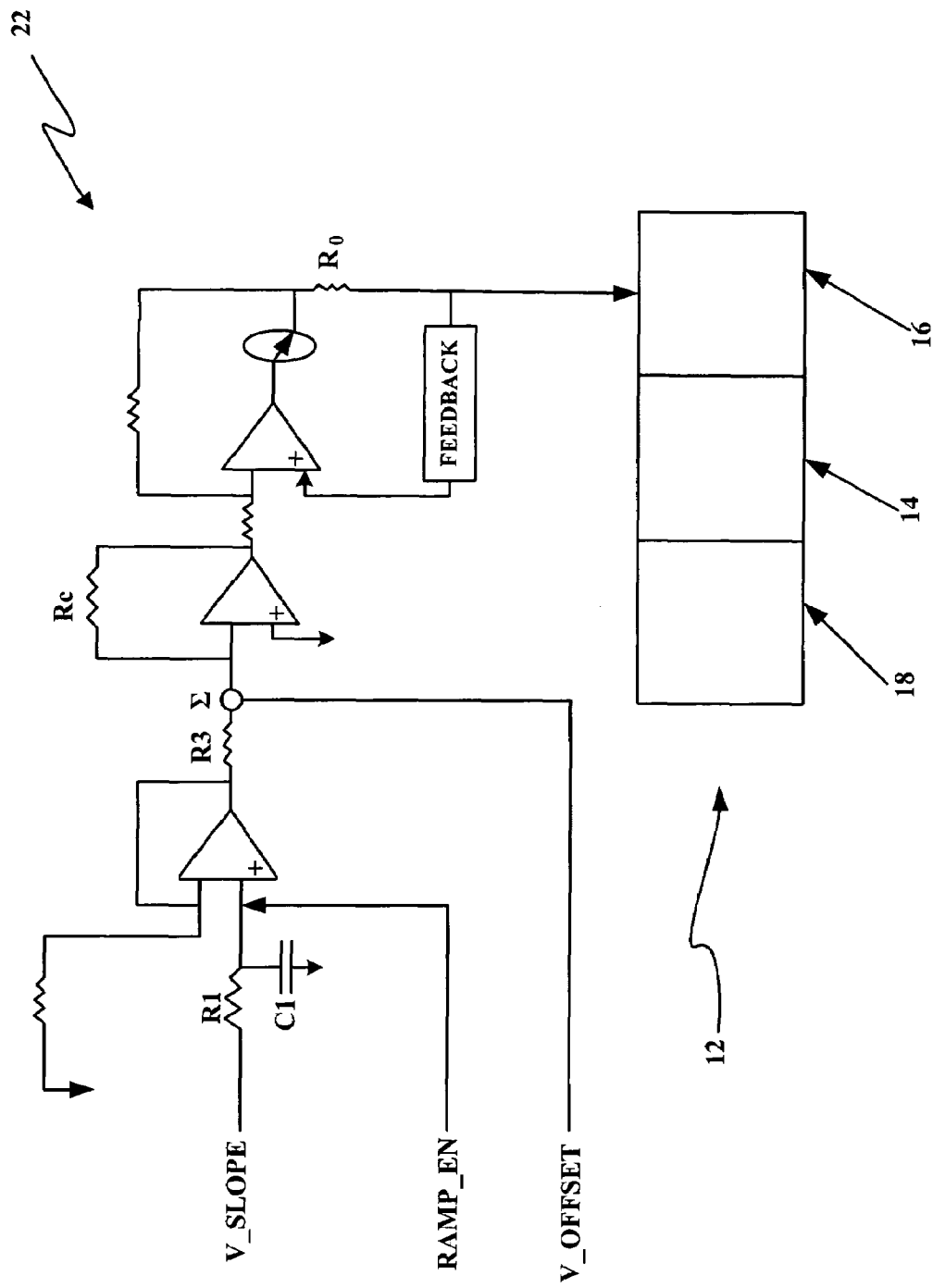
FIG. 4 is an exemplary circuit diagram of a circuit used to provide a synchronized current ramp for the tuning sections of a DBR laser, as shown in FIG. 1.

FIG. 4 is an exemplary circuit diagram of a circuit used to provide a current ramp for the Bragg current input 22 to the Bragg section 16 of the DBR laser 12. The beginning point of the ramp (V_Offset), the slope (V_Slope), and the time (Ramp_En) of each ramp may be characterized for the DBR laser 12 and stored in memory. A similar circuit is used to provide a current ramp for the Phase current input 20, with different ramps, slopes, and time, as appropriate. As illustrated in FIG. 3, several sets (Phase and Bragg) of tuning ramp segments may be used to tune the DBR laser 12, and the number of sets of segments is dependent on the slope of the resultant wavelength versus time curves.

Figure 5:
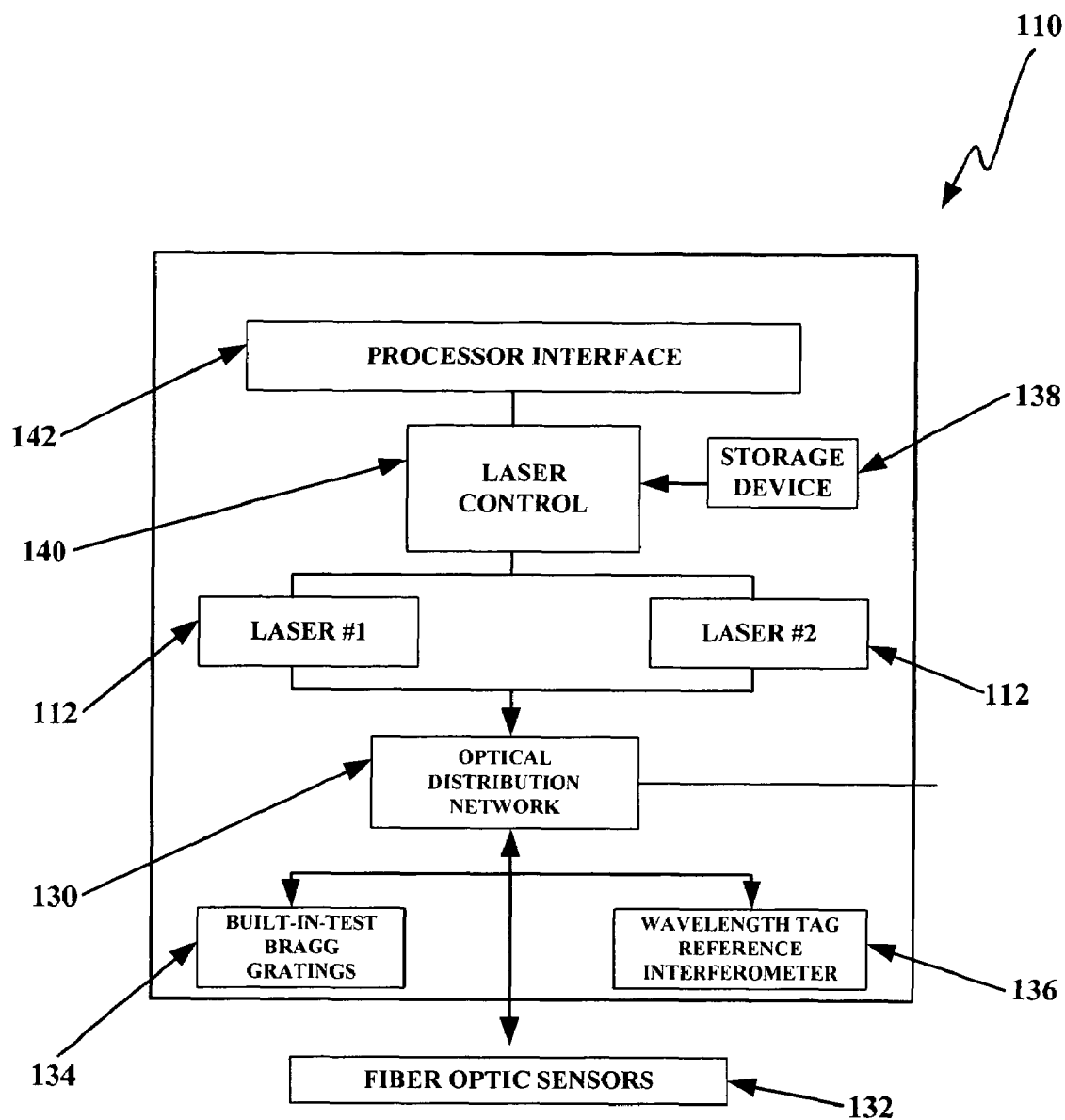
FIG. 5 is a block diagram of a continuous tunable laser system, in accordance with a second exemplary embodiment of the invention.

FIG. 5 is a block diagram of a continuous tunable laser system 110, in accordance with a second exemplary embodiment of the invention. The continuous tunable laser system 110 includes two DBR lasers 112 (labeled Laser #1 and Laser #2). Each DBR laser 112 includes a Phase section, a Bragg section, and a gain medium. Each DBR laser 112 is capable of generating a continuous-wave laser signal over a particular wavelength region. A separate Phase current input is electrically connected to each of the Phase sections of the DBR laser 112. In addition, a separate Bragg current input is electrically connected to each of the Bragg sections and synchronized with the Phase current inputs. A separate gain control input is electrically connected to the gain mediums of the DBR lasers 112, the gain control inputs powering the DBR lasers 112.

Two DBR lasers 112 may be used to cover the required tuning range of the continuous tunable laser system 110. Each DBR laser 112 may provide approximately 4.25 nanometers of tuning, combining to provide 9.5 nanometers of tuning. Of course, other ranges of tuning may be provided under different embodiments. The fiber optic sensors 132 contain Bragg Gratings, which have a nominal peak response at 1550 nanometers for this exemplary embodiment. Each DBR laser 112 may output a continuous wave signal into an optical distribution network 130. In addition, each DBR laser 112 may incorporate a built-in isolator to reduce the effect of backreflections from the optical power distribution network 130.

The optical power distribution network 130 may be used to evenly distribute a laser signal to a plurality of fiber optic sensors 132, built-in-test (BIT) Bragg gratings 134, and a wavelength reference Michelson interferometer 136. The optical power distribution network 130, for example, may include a 2×16 waveguide coupler, 14 1×2 fiber couplers, and a 2×2 fiber coupler. The waveguide coupler may be used for power splitting. The 1×2 fiber couplers may be used to allow the signal to go out to the fiber optic sensors 132 and BIT Bragg gratings 134, while providing a reflective signal, which is used for measuring the sensor/Bragg gratings response. The 2×2 coupler allows the laser input signal to be split into two arms of the interferometer 136, while providing a reflected signal, which is used as the wavelength tagging reference.

The BIT Bragg gratings 134 may not be temperature stabilized. The BIT Bragg gratings 134 may have a center wavelength of approximately 1548 nm and approximately 1552 nm and a bandwidth of approximately 0.5 nm. They may each be within each DBR laser 112 tuning range and may serve to verify that each DBR laser 112 is tuning correctly and outputting correct amounts of power by verifying the peak wavelength response and peak power level with certain limits. The testing limits will be determined by characterization and the possible utilization of temperature compensation.

The interferometer 136, which may, for instance, be a Michelson interferometer, is used as a wavelength reference to tag the measurement data that is acquired at a fixed sampling rate. The interferometer 136 may include a 2×2 coupler, a high numerical aperture fiber, and two Faraday Rotator Mirrors. As the DBR laser 112 tunes over its wavelength range, the interferometer 136 output produces a function whose period represents a change in the wavelength. This change in the wavelength is a function of a difference in length between the two interferometer arms. As is known to those having ordinary skill in the art, each peak or null detected through the interferometer is considered a sample and the number of samples received over a known fixed tuning interval is used to calculate the wavelength for each sample.

Tuning data, such as the exemplary characteristics shown in FIG. 2 and FIG. 3 of the first embodiment, may be used to control and tune the DBR lasers 112. The tuning data may be stored in a storage device 138 of the continuous tunable laser system 110. The storage device 138 may be in electrical communication with a laser control 140. The laser control 140 controls feeding of the tuning currents to each of the DBR lasers 112. With respect to FIG. 4, the laser control 140 may control the beginning point of the ramp (V_Offset), the slope (V_Slope), and the time (Ramp_En) of each ramp produced by the tuning current circuits. The laser control 140 may operate with the storage device 138 to keep the Phase current input and the Bragg current input synchronized. The processor interface 142 allows access to and adjustment of the laser control 140. This access may be used to initiate and interrupt continuous signal sweeps or to make modifications to the tuning data in the storage device 138.

Figure 6:
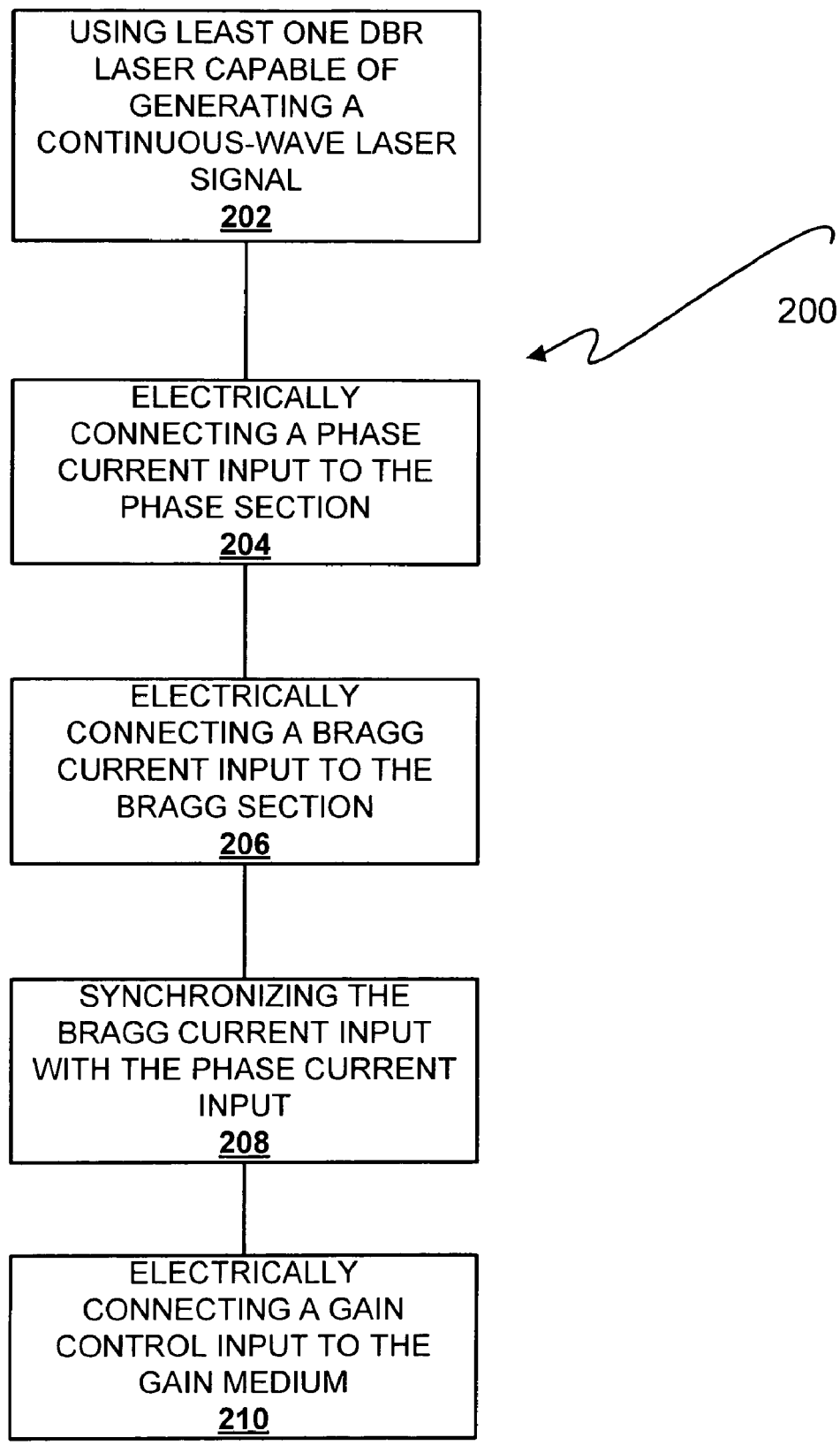
FIG. 6 is a flow chart that shows the functionality and operation of a possible implementation of the method of enabling continuous wavelength tuning of a DBR laser, in accordance with the first exemplary embodiment shown in FIG. 1.

FIG. 6 is a flow chart that shows the functionality and operation of a possible implementation of the method of enabling continuous wavelength tuning of a DBR laser, in accordance with the first exemplary embodiment shown in FIG. 1. In this regard, each block represents a module, segment, or step, which comprises one or more instructions for implementing the specified function. It should also be noted that in some alternative implementations, the functions noted in the blocks might occur out of the order noted in FIG. 6. For example, two blocks shown in succession in FIG. 6 may in fact be executed non-consecutively, substantially concurrently, or the blocks may sometimes be executed in the reverse order, depending upon the functionality involved, as will be further clarified herein.

FIG. 6 is a flow chart illustrating a method 200 for making a continuously tunable laser system 10. The method 200 includes using at least one DBR laser 12 capable of generating a continuous-wave laser signal (block 202). The DBR laser 12 including a Phase section 14, a Braggs section 16, and a gain medium 18. A Phase current input 20 is electrically connected to the Phase section 14 (block 204). A Bragg current input 22 is electrically connected to the Bragg section 16 (block 206). The Bragg current input 22 is synchronized with the Phase current input 20 (block 208). A gain control input 24 is electrically connected to the gain medium 18 (block 210).

It should be emphasized that the above-described embodiments of the present invention are merely possible examples of implementations, simply set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

We claim:

1. A continuous tunable laser system, comprising:
   at least one DBR laser, including a Phase section, a Braggs section, and a gain medium, the DBR laser capable of generating a continuous-wave laser signal;
   a Phase current input electrically connected to the Phase section;
   a Bragg current input electrically connected to the Bragg section and synchronized with the Phase current input;
   a gain control input electrically connected to the gain medium.

2. The system of claim 1, the optical distribution network further comprising an interterometer adapted to receive the response signals from the Bragg gratings.

3. The system of claim 1, the system further comprising a current ramp electrically positioned to feed the Phase current input and the Bragg current input.

4. The system of claim 3, wherein the current ramp is linear.

5. The system of claim 3, wherein the current ramp has a predetermined starting point, a predetermined slope, a predetermined duration.

6. The system of claim 3, the system further comprising a plurality of current ramps, wherein each current ramp has a predetermined starting point, a predetermined slope, a predetermined duration.

7. The system of claim 3, wherein the current ramp is at least partially generated by a charging capacitor.

8. The system of claim 1, further comprising a laser control connected to the Phase current input and the Bragg current input, the laser control synchronizing the Phase current input and the Bragg current input.

9. The system of claim 8, further comprising tuning data stored in a memory and connected to the laser control whereby the laser control uses the tuning data to synchronize the Phase current input and the Bragg current input.

10. The system of claim 8 further comprising:
   a test Bragg Gratings set positioned to reflect at least a portion of the laser signal; and
   a sensor connected to the laser control.

11. The system of claim 1 further comprising test Bragg Gratings positioned to reflect at least a portion of the laser signal.

12. A method for making a continuously tunable laser system, the method comprising the steps of:
   generating a continuous-wave laser signal using at least one DBR laser, the DBR laser including a Phase section, a Braggs section, and a gain medium;
   electrically connecting a Phase current input to the Phase section;
   electrically connecting a Bragg current input to the Bragg section;
   synchronizing the Bragg current input with the Phase current input;
   electrically connecting a gain control input to the gain medium.

13. The method of claim 12, further comprising the step of electrically connecting a laser control to the Phase current input and the Bragg current input, wherein the laser control synchronizes the Phase current input and the Bragg current input.

14. The method of claim 13, further comprising the step of storing tuning data in a memory and putting the memory in electrical communication with the laser control whereby the laser control uses the tuning data to synchronize the Phase current input and the Bragg current input.

15. The method of claim 12, further comprising electrically positioning a separate current ramp circuit to feed each of the Phase current input and the Bragg current input.

16. The method of claim 12, further comprising the step of reflecting the laser signal with test Bragg Gratings.

17. A system for controlling a DBR laser, the DBR laser including a Phase section, a Braggs section, and a gain medium, the system comprising:
   means for generating a laser signal from the gain medium and through the Phase section and Bragg section;
   means for controlling a carrier density the Phase section;
   means for controlling a laser cavity Bragg Grating resonant wavelength; and
   means for synchronizing the means for controlling a carrier density of the Phase section with the means for controlling a laser cavity Bragg Grating resonant wavelength;
   means for receiving the laser signal with an optical distribution network; and means for distributing the laser signal to a plurality of Bragg gratings, wherein the optical distribution network is adapted to receive a plurality of response signals from the Bragg gratings.

* * * * *

UNITED STATES PATENT AND TRADEMARK OFFICE
CERTIFICATE OF CORRECTION

PATENT NO. : 7,254,146 B2 Page 1 of 1
APPLICATION NO. : 11/039589
DATED : August 7, 2007
INVENTOR(S) : Bodan et al.

It is certified that error appears in the above-identified patent and that said Letters Patent is hereby corrected as shown below:

Column 6, Line 50, Claim 1, after "medium" insert --and an optical distribution network positioned to receive the laser signal from the DBR laser and distribute the laser signal to a plurality of Bragg gratings, wherein the optical distribution network is adapted to receive a plurality of response signals from the Bragg gratings--.

Column 7, Line 28, Claim 12, after "medium" insert --; positioning an optical distribution network to receive the laser signal from the DBR laser; and distributing the laser signal to a plurality of Bragg gratings, wherein the optical distribution network is adapted to receive a plurality of response signals from the Bragg gratings --.

Column 8, Line 19, Claim 17, after "density" insert --of--.

Column 8, Line 21, Claim 17, after "wavelength;" delete "and".

Signed and Sealed this

Thirtieth Day of October, 2007

JON W. DUDAS
*Director of the United States Patent and Trademark Office*